(12) United States Patent
Sato et al.

(10) Patent No.: US 12,712,013 B2
(45) Date of Patent: Aug. 18, 2026

(54) SEMICONDUCTOR DEVICE PERFORMING LOOPBACK OPERATION

(71) Applicant: MICRON TECHNOLOGY, INC., Boise, ID (US)

(72) Inventors: Yuichiro Sato, Sagamihara (JP); Shingo Mitsubori, Tokyo (JP); Ryo Fujimaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 18/780,106

(22) Filed: Jul. 22, 2024

(65) Prior Publication Data

US 2025/0157526 A1 May 15, 2025

Related U.S. Application Data

(60) Provisional application No. 63/598,685, filed on Nov. 14, 2023.

(51) Int. Cl.

| | |
|---|---|
| ***G11C 11/40*** | (2006.01) |
| ***G11C 11/4076*** | (2006.01) |
| ***G11C 11/4093*** | (2006.01) |
| ***G11C 11/4096*** | (2006.01) |

(52) U.S. Cl.
CPC ...... *G11C 11/4096* (2013.01); *G11C 11/4076* (2013.01); *G11C 11/4093* (2013.01)

(58) Field of Classification Search
CPC ............ G11C 11/4096; G11C 11/4076; G11C 11/4093
See application file for complete search history.

(56) References Cited

U.S. PATENT DOCUMENTS

2018/0136866 A1* 5/2018 Eugenio .................. G06F 11/22

* cited by examiner

*Primary Examiner* — Xiaochun L Chen
(74) *Attorney, Agent, or Firm* — Dorsey & Whitney LLP

(57) ABSTRACT

An example apparatus includes a first circuit configured to receive a plurality of first write data and then a plurality of second write data responsive to a write command; a second circuit configured to select one or ones of the plurality of first write data and one or ones of the plurality of second write data based, at least in part, on a first selection signal and a second selection signal following the first selection signal, respectively; and a third circuit configured to: receive an internal write command signal provided correspondingly to the write command; mask a portion of the internal write command signal a timing of which partially overlaps the plurality of first write data to provide a masked internal write command signal; and provide the second selection signal based, at least in part, on the second internal command signal.

20 Claims, 9 Drawing Sheets

SEMICONDUCTOR DEVICE PERFORMING LOOPBACK OPERATION

CROSS REFERENCE TO RELATED APPLICATION(S)

This application claims priority to U.S. Provisional Application No. 63/598,685, filed Nov. 14, 2023. The aforementioned application is incorporated herein by reference, in its entirety, for any purpose.

BACKGROUND

A DDR5 DRAM has a loopback Write Burst Output Mode function that sends back a portion of write data received from a host to the host before writing the write data to a memory cell array.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
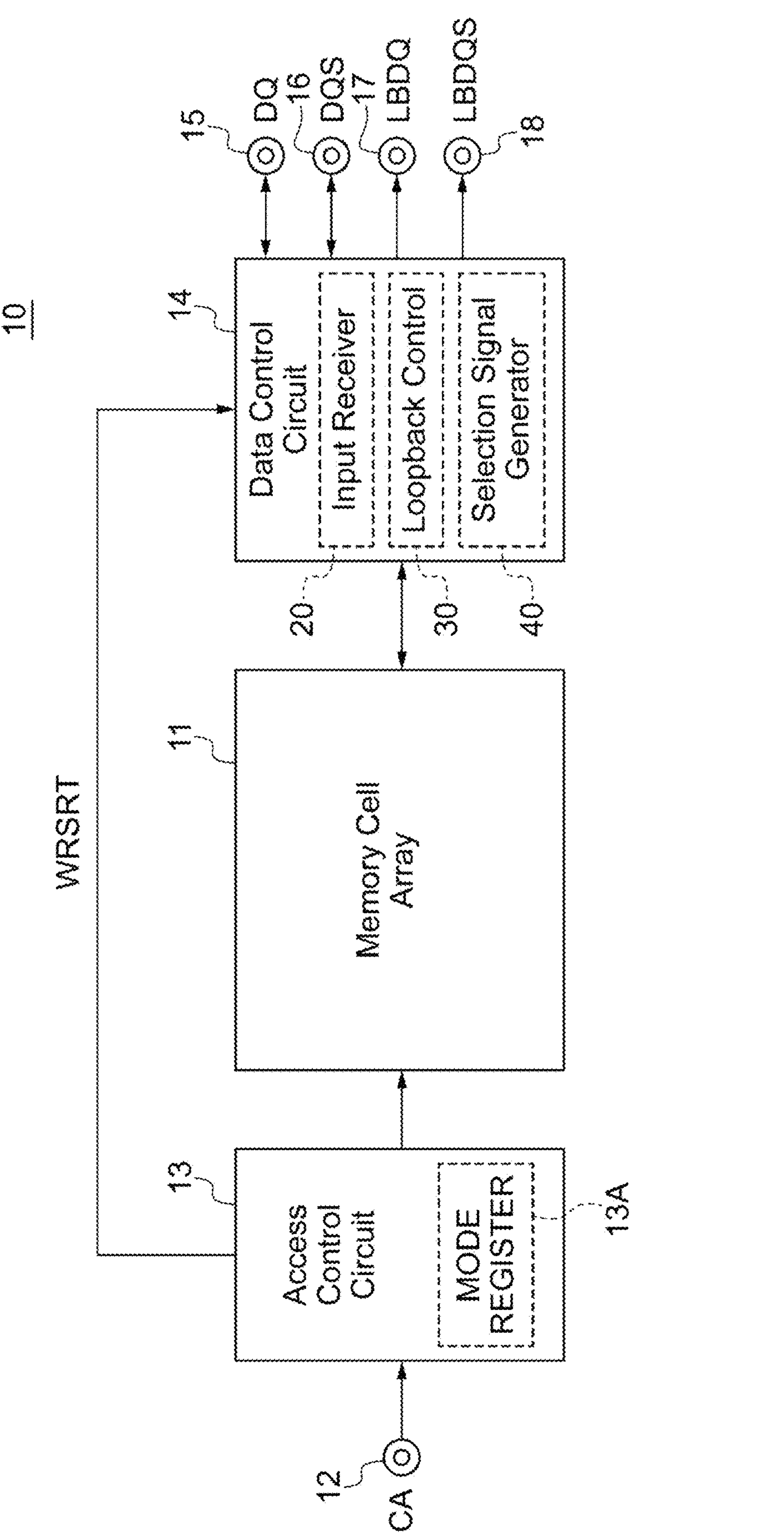
FIG. 1 is a block diagram showing a configuration of a semiconductor memory device according to an embodiment of the present disclosure.

FIG. 1 is a block diagram showing a configuration of a semiconductor memory device 10 according to an embodiment of the present disclosure. The semiconductor memory device 10 shown in FIG. 1 is a DDR5 DRAM and includes a memory cell array 11. When access is to be made to the memory cell array 11, a command address signal CA is input to a command address terminal 12 from outside. The command address signal CA is supplied to an access control circuit 13. When a command included in the command address signal CA indicates a read operation, the access control circuit 13 makes read-access to a memory cell included in the memory cell array 11 based on an address included in the command address signal CA. Read data DQ read out from the memory cell thus accessed is output to the outside from a data I/O terminal 15 via a data control circuit 14.

Figure 2:
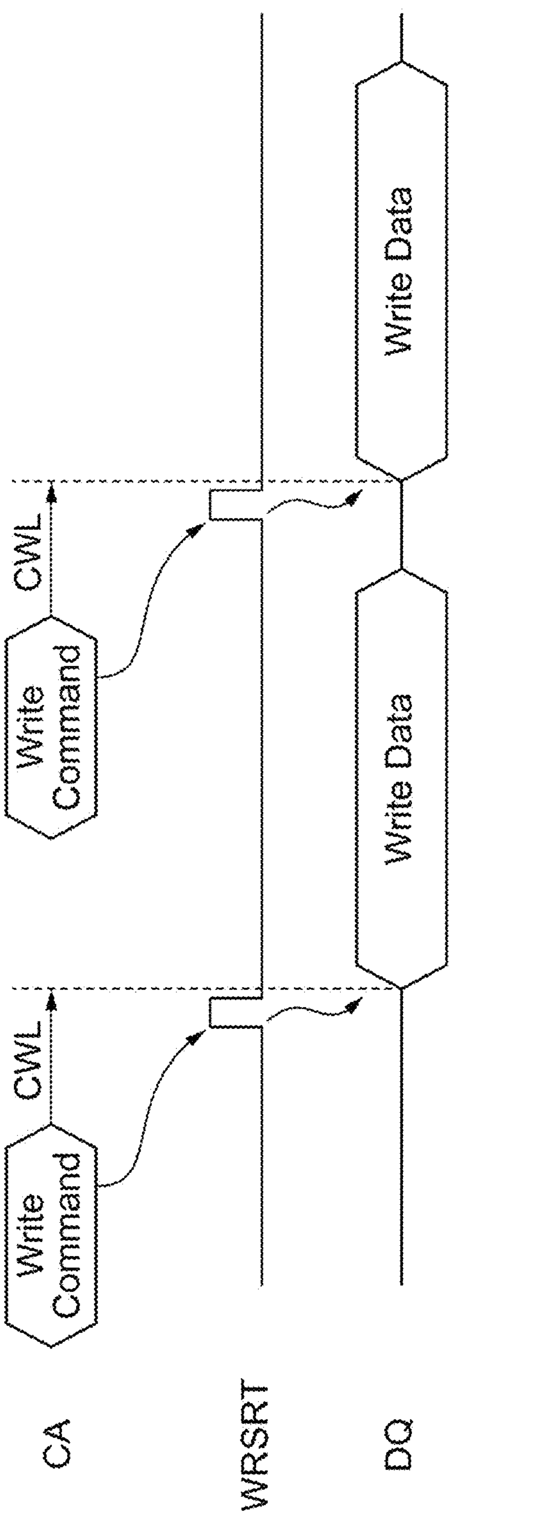
FIG. 2 is a timing chart for explaining a generation timing of a write start signal.

When the command included in the command address signal CA indicates a write operation, the access control circuit 13 activates a write start signal WRSRT at a predetermined timing. As shown in FIG. 2, the write start signal WRSRT is activated at a timing immediately before burst input of a plurality of write data DQ to the data I/O terminal 15 from the outside. The burst input of the write data DQ is started after a predetermined delay time CWL has passed after issuance of a write command. The write data DQ input to the data I/O terminal 15 is transferred to the memory cell array 11 via an input receiver circuit 20 included in the data control circuit 14. The write data DQ is input synchronously with a data strobe signal DQS supplied to a data strobe terminal 16. The write data DQ transferred to the memory cell array 11 is written to a memory cell included in the memory cell array 11 based on the address included in the command address signal CA.

The data control circuit 14 includes a loopback control circuit 30. The loopback control circuit 30 sends back loopback data LBDQ, which is a portion of the write data DQ, from a loopback terminal 17 to a host. The loopback data LBDQ is output synchronously with a loopback strobe signal LBDQS output from a loopback strobe terminal 18.

Figure 3:
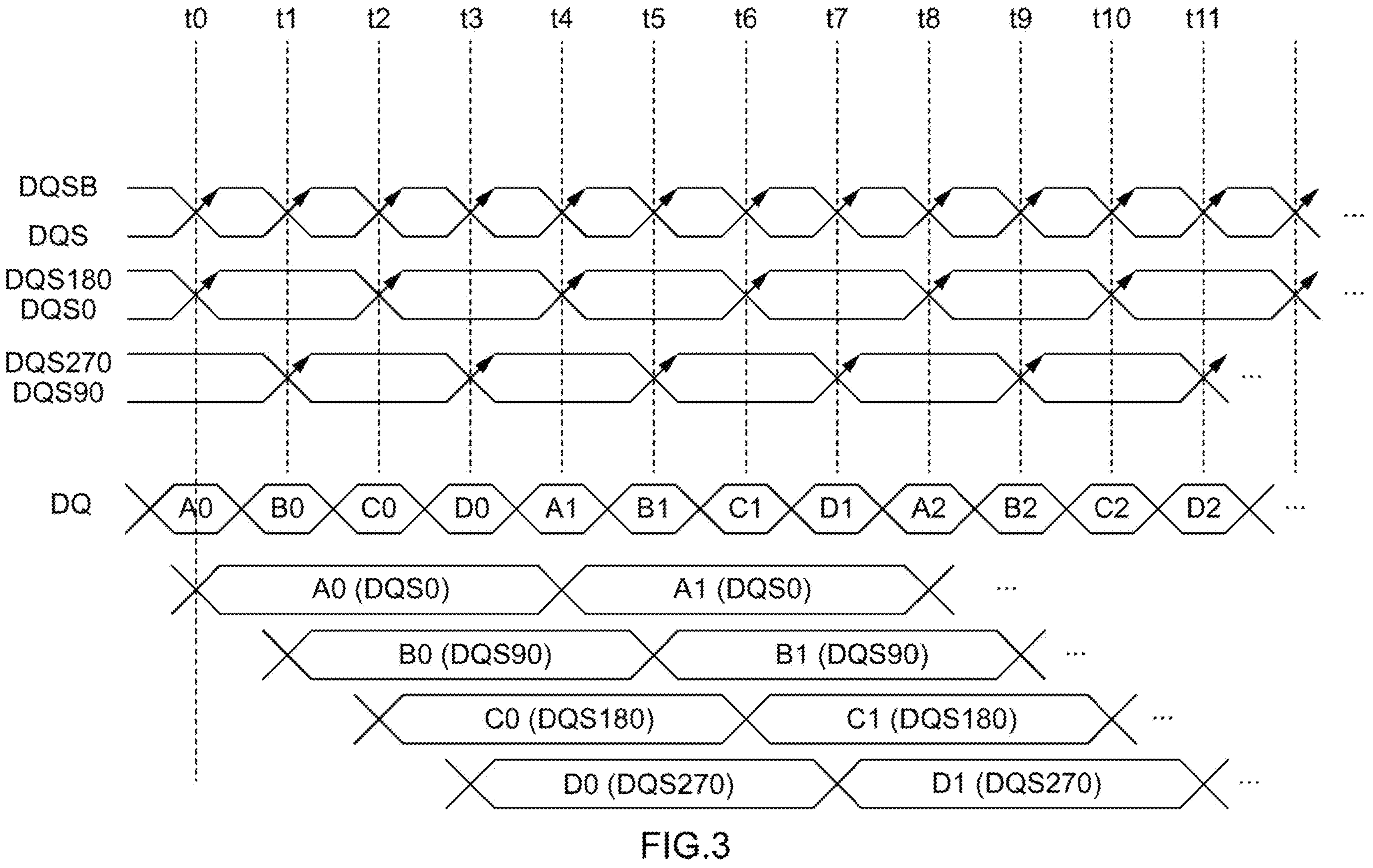
FIG. 3 is a timing chart for explaining a method of selecting loopback data.

FIG. 3 is a timing chart for explaining a method of selecting the loopback data LBDQ. In the example shown in FIG. 3, plural pieces of write data DQ input at times t0, t1, t2, and t3 are respectively denoted by A0, B0, C0, and D0, plural pieces of write data DQ input at times t4, t5, t6, and t7 are respectively denoted by A1, B1, C1, and D1, and plural pieces of write data DQ input at times t8, 19, t10, and t11 are respectively denoted by A2, B2, C2, and D2. The data strobe signal DQS is divided into four phases, so that a division signal DQS0 rising at DQS=0°, a division signal DQS90 rising at DQS=90°, a division signal DQS180 rising at DQS=180°, and a division signal DQS270 rising at DQS=270° are generated. When the division signal DQS0 is selected, the data A0, the data A1, . . . among the plurality of write data DQ are selected as the loopback data LBDQ. When the division signal DQS90 is selected, the data B0, the data B1, . . . among the plurality of write data DQ are selected as the loopback data LBDQ. When the division signal DQS180 is selected, the data C0, the data C1, . . . among the plurality of write data DQ are selected as the loopback data LBDQ. When the division signal DQS270 is selected, the data D0, the data D1, . . . among the plurality of write data DQ are selected as the loopback data LBDQ.

Figure 4:
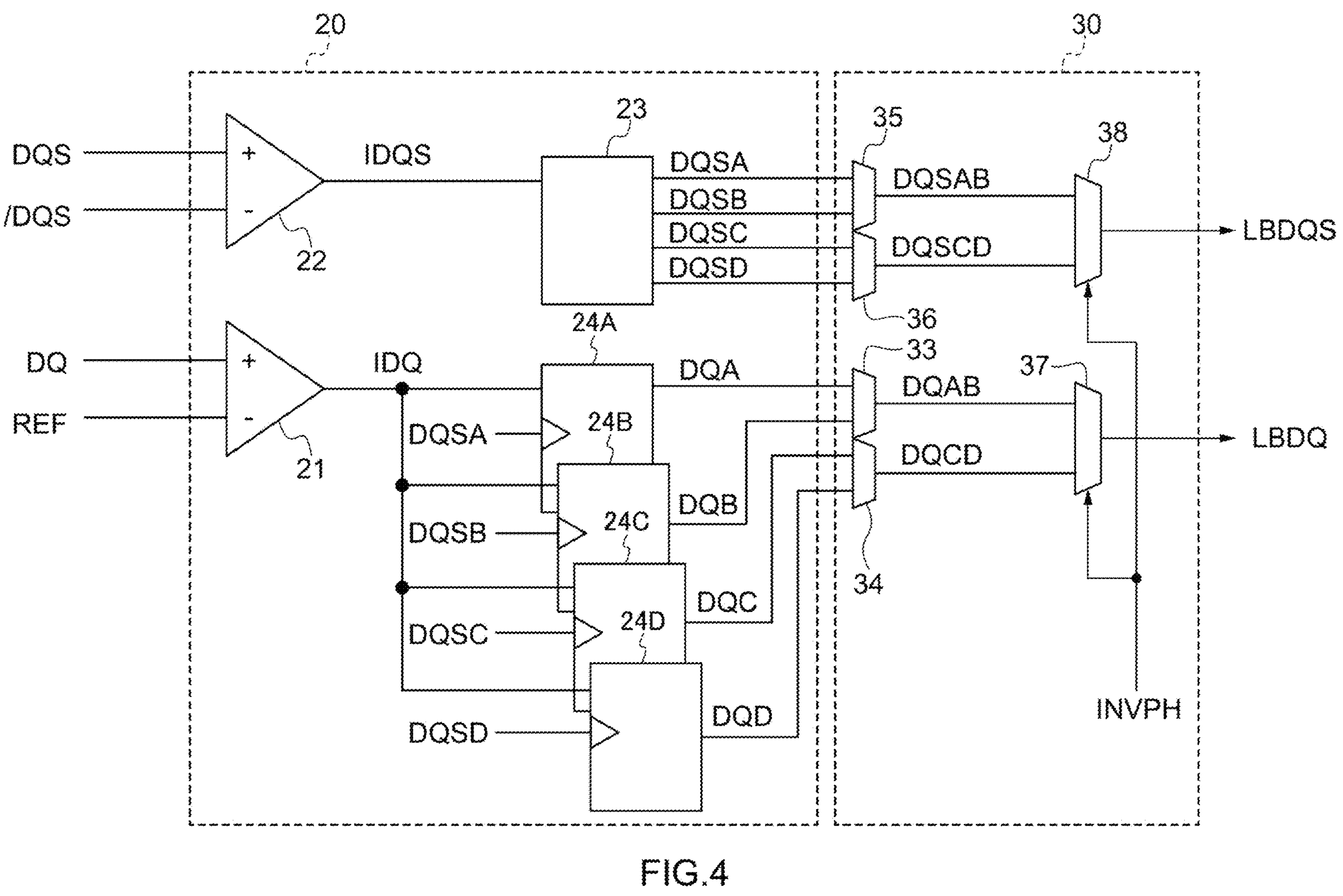
FIG. 4 is a circuit diagram showing portions of an input receiver circuit and a loopback control circuit.

FIG. 4 is a circuit diagram showing portions of the input receiver circuit 20 and the loopback control circuit 30. As shown in FIG. 4, the loopback control circuit 30 includes multiplexers 33 to 38. The input receiver circuit 20 includes an input receiver circuit 21 that generates internal write data IDQ based on the write data DQ and a reference signal REF. The internal write data IDQ is supplied to latch circuits 24A to 24D included in the input receiver circuit 20 in common. The latch circuits 24A to 24D latch the internal write data IDQ synchronously with data strobe signals DQSA, DQSB, DQSC, and DQSD, respectively. The phases of the data strobe signals DQSA, DQSB, DQSC, and DQSD are different from each other by 90°. The internal write data IDQ is thus divided into write data DQA, DQB, DQC, and DQD for four phases different from each other by 90°. The loopback control circuit 30 has a function of selecting a data strobe signal for one phase or one write data. Among the write data DQA, DQB, DQC, and DQD for four phases, one of the write data DQA and the write data DQB is selected by the multiplexer 33, and one of the write data DQC and the write data DQD is selected by the multiplexer 34. The operations of the multiplexers 33 and 34 are linked to each other, and when the write data DQA is selected, the write data DQC is selected, and when the write data DQB is selected, the write data DQD is selected. Accordingly, the phase of write data DQAB output from the multiplexer 33 and the phase of write data DQCD output from the multiplexer 34 are different from each other by 180°. The write data DQAB and the write data DQCD are supplied to the multiplexer 37. The multiplexer 37 selects one of the write data DQAB and the write data DQCD based on a selection signal INVPH. The data selected by the multiplexer 37 is output to the outside from the loopback terminal 17 as the loopback data LBDQ. The selection signal INVPH is generated by a selection signal generation circuit 40 included in the data control circuit 14.

The input receiver circuit 20 further includes an input receiver circuit 22 that generates an internal data strobe signal IDQS based on the data strobe signal DQS and its inverted signal/DQS. The internal data strobe signal IDQS is supplied to a divider circuit 23 included in the input receiver circuit 20. The divider circuit 23 divides the internal data strobe signal IDQS into the data strobe signals DQSA, DQSB, DQSC, and DQSD for four phases different from each other by 90°. Among these signals, one of the data strobe signals DQSA and DQSB is selected by the multiplexer 35, and one of the data strobe signals DQSC and DQSD is selected by the multiplexer 36. The operations of the multiplexers 35 and 36 are linked to the operations of the multiplexers 33 and 34. That is, when the write data DQA or DQC is selected, the data strobe signal DQSA or DQSC is selected, and when the write data DQB or DQD is selected, the data strobe signal DQSB or DQSD is selected. Data strobe signals DQSAB and DQSCD are supplied to the multiplexer 38. The operation of the multiplexer 38 is linked to the operation of the multiplexer 37. That is, when the write data DQAB is selected, the data strobe signal DQSAB is selected, and when the write data DQCD is selected, the data strobe signal DQSCD is selected. The data strobe signal selected by the multiplexer 38 is output to the outside from the loopback strobe terminal 18 as the loopback strobe signal LBDQS.

Selection by each of the multiplexers 33 to 38 is determined by a set value in a mode register 13A included in the access control circuit 13. That is, the phase of the write data DQ selected as the loopback data LBDQ is determined by the set value in the mode register 13A. However, the phase of the write data DQ selected as the loopback data LBDQ needs to be dynamically changed by using the selection signal INVPH for the following reason.

Figure 5:
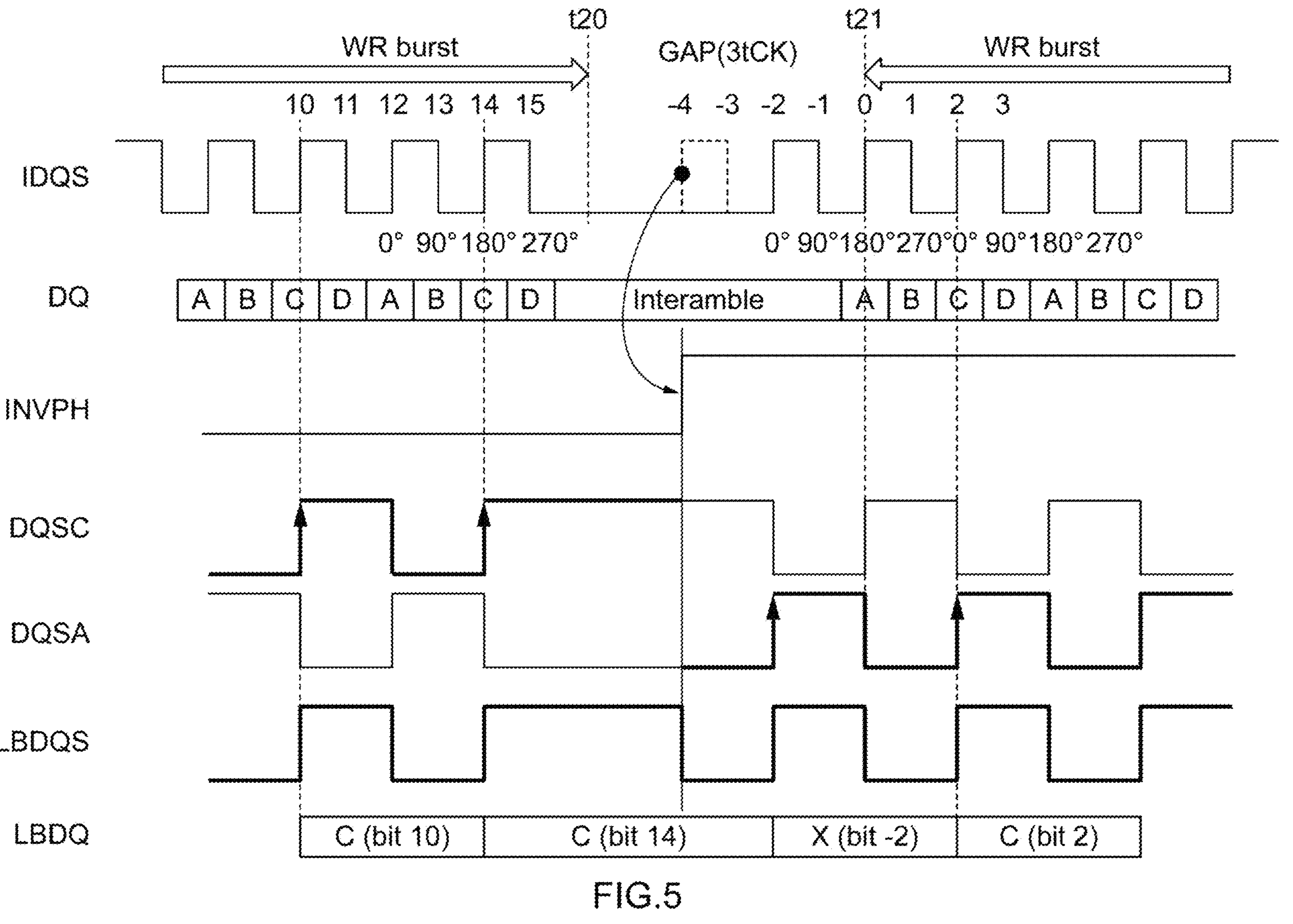
FIG. 5 is a timing chart for explaining the necessity of a selection signal.

FIG. 5 is a timing chart for explaining the necessity of the selection signal INVPH. In the example shown in FIG. 5, burst input of the write data DQ in the first write operation ends at a time t20, and burst input of the write data DQ in the second write operation starts at a time t21. A gap period between the time t20 and the time t21 corresponds to three clock cycles. In a case where a CRC is valid, the gap period also includes a CRC bit period. In other words, a CRC bit is not a portion of the write data DQ. In a case where write operations are consecutively performed in this manner, when a toggle count of the internal data strobe signal IDQS in the gap period from an end timing of a previous write operation to a start timing of a next write operation is odd numbered, the phase of the write data DQ in the previous write operation and the phase of the write data DQ in the next write operation are inverted by 180°. That is, in the first write operation, write data A corresponds to DQS0, write data B corresponds to DQS90, write data C corresponds to DQS180, and write data D corresponds to DQS270, whereas in the second write operation, the write data A corresponds to DQS180, the write data B corresponds to DQS270, the write data C corresponds to DQS0, and the write data D corresponds to DQS90. However, since the phase of the write data DQ to be output as the loopback data LBDQ is determined by the set value in the mode register 13A, it becomes necessary to switch the phase of the write data DQ selected as the loopback data LBDQ by 180° by changing the logic level of the selection signal INVPH, when a situation occurs where the toggle count of the internal data strobe signal IDQS in the gap period from the end timing of the previous write operation to the start timing of the next write operation is odd numbered. In the example shown in FIG. 5, in a write operation before the time t20, the selection signal INVPH is at a low level, and DQSC is thus selected. In response to this selection, the write data C is output as the loopback data LBDQ from the loopback terminal 17. After all the write data DQ is input in association with the first write operation, the selection signal INVPH is changed to be at a high level before start of input of the write data DQ in association with the second write operation. As a result of this change, DQSA is selected, and in response to this selection, the write data C is output from the loopback terminal 17 as the loopback data LBDQ. The selection signal INVPH changes synchronously with a preamble portion of the internal data strobe signal IDQS input in association with the second write operation. In the example shown in FIG. 5, the preamble portion of the internal data strobe signal IDQS includes four active edges, and the selection signal INVPH changes synchronously with the first one of those active edges.

Figure 6A:
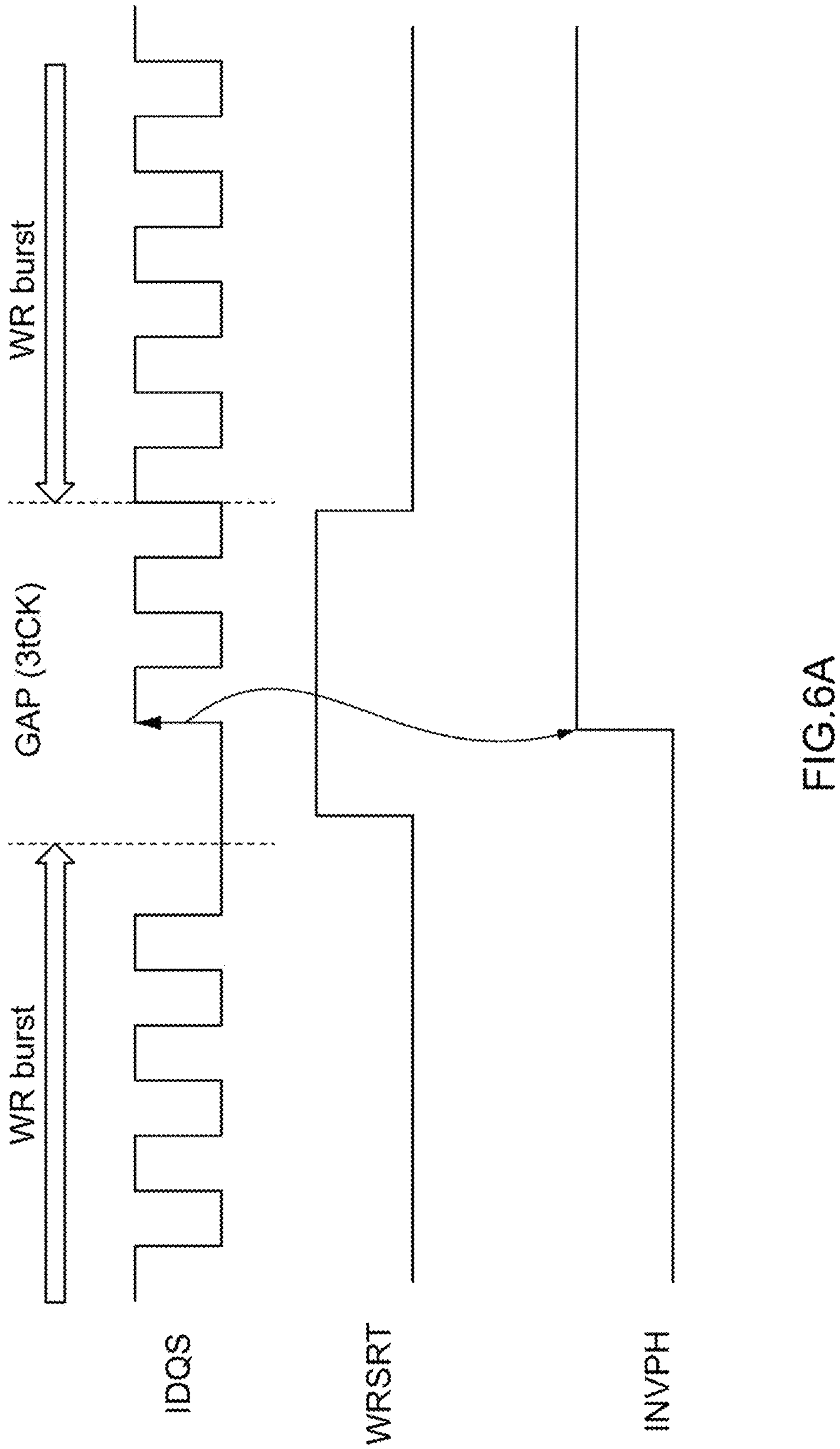
FIGS. 6A and 6B are timing charts for explaining a relation between a generation timing of the write start signal and a change timing of the selection signal.
Figure 6B:
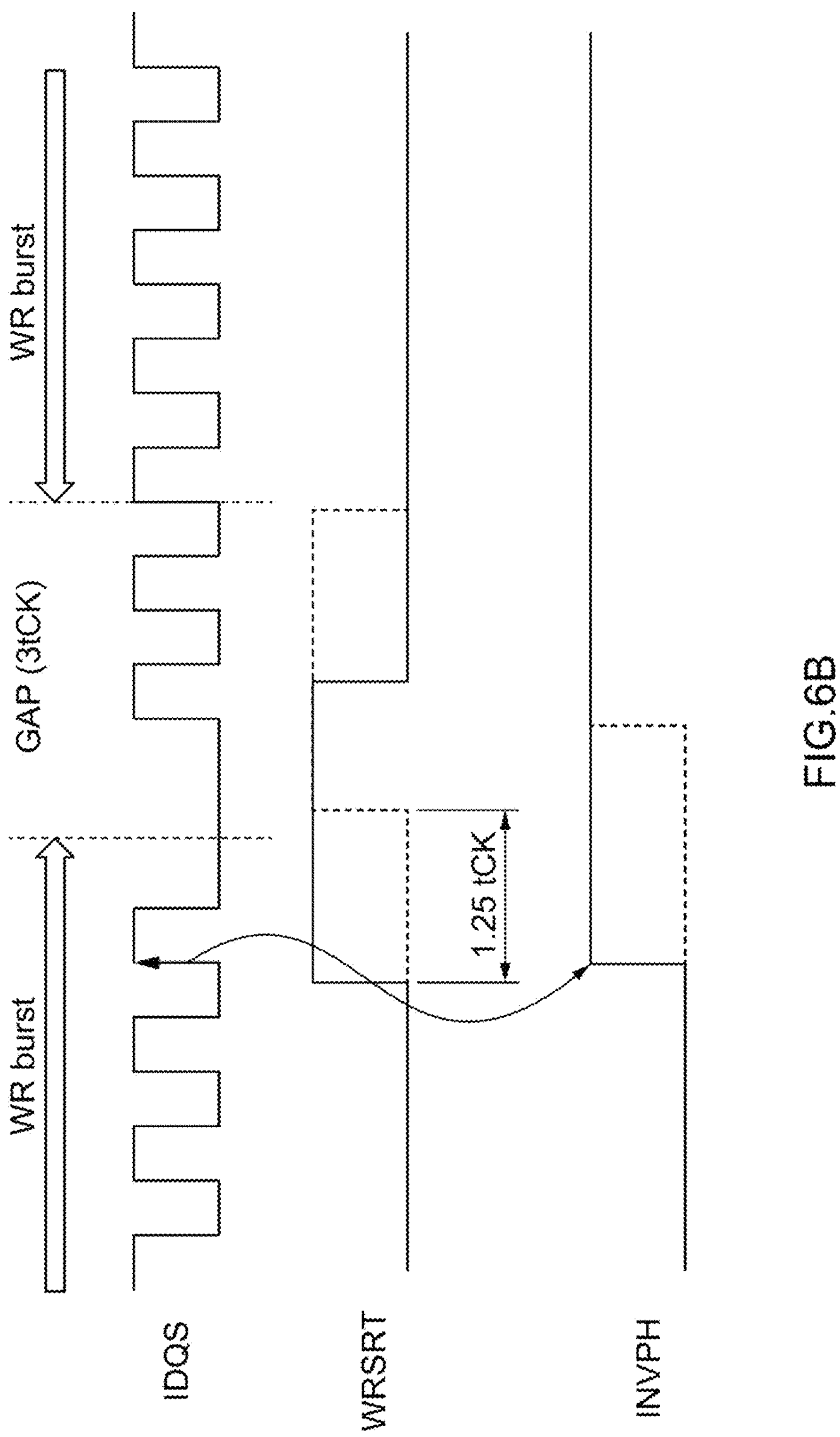

FIGS. 6A and 6B are timing charts for explaining a relation between a generation timing of the write start signal WRSRT and a change timing of the selection signal INVPH. As shown in FIG. 6A, the selection signal INVPH changes in response to a rising edge of the internal data strobe signal IDQS, on the condition that the write start signal WRSRT is active. In the example shown in FIG. 6A, the write start signal WRSRT is activated after the end of burst input of the write data DQ in a previous write operation and before input of a preamble portion of the internal data strobe signal IDQS in association with a next write operation. In this case, the selection signal INVPH changes synchronously with the first one of active edges constituting the preamble portion of the internal data strobe signal IDQS. Consequently, the phase of the loopback data LBDQ is switched correctly. However, the write start signal WRSRT is a signal derived from a write command and is not synchronized with the data strobe signal DQS accurately. Although the timing difference between the write start signal WRSRT and the data strobe signal DQS is adjusted by Write Leveling training executed by a host, the specification allows a timing difference to some extent (for example, 1.25tCK). FIG. 6B shows a case where the write start signal WRSRT is activated earlier than an ideal timing by 1.25tCK. If the timing of activation of the write start signal WRSRT is too early as shown in FIG. 6B, the selection signal INVPH may change synchronously with the data strobe signal DQS input in association with the previous write operation. In this case, the selection signal INVPH changes in the middle of burst input of the write data DQ, and therefore the correct loopback data LBDQ is no longer selected.

Figure 7:
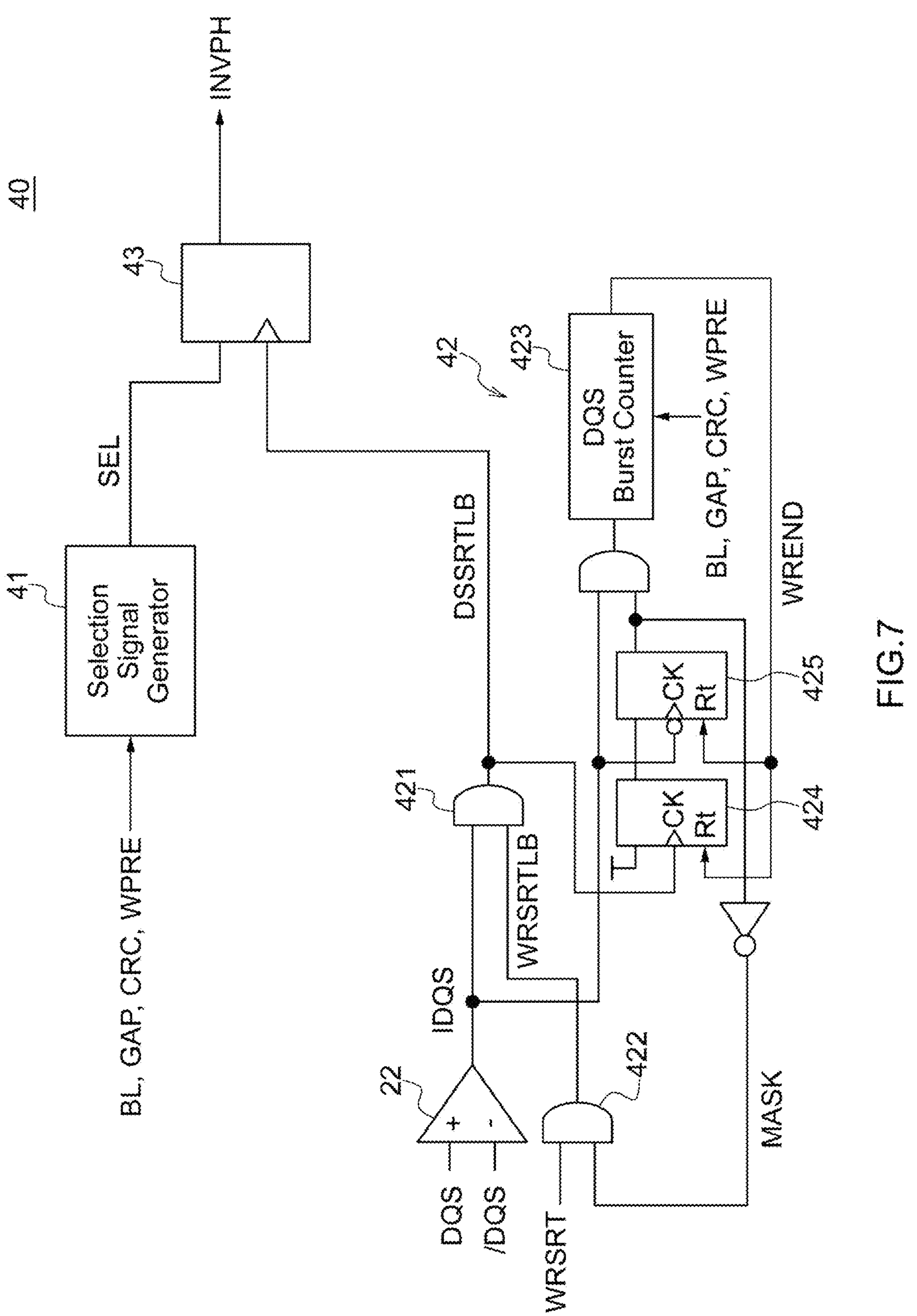
FIG. 7 is a circuit diagram of a selection signal generation circuit.

FIG. 7 is a circuit diagram of the selection signal generation circuit 40. As shown in FIG. 7, the selection signal generation circuit 40 includes a signal generation circuit 41 that generates a selection signal SEL, a timing signal generation circuit 42 that generates a timing signal DSSRTLB, and a latch circuit 43 that latches the selection signal SEL synchronously with the timing signal DSSRTLB and outputs the latched signal as the selection signal INVPH. The signal generation circuit 41 decides the phase of the write data DQ based on a signal BL indicating the burst length, a signal GAP indicating the length of a gap period, the signal CRC indicating whether a CRC (Cyclic Redundancy Check) process is necessary, and a signal WPRE indicating the length of a preamble of the data strobe signal DQS in a write operation. The signal generation circuit 41 places the selection signal SEL at a low level, for example, when deciding that the write data DQ synchronized with the data strobe signal DQSC is to be looped back, and places the selection signal SEL at a high level when deciding the write data DQ synchronized with the data strobe signal DQSA is to be looped back.

The timing signal generation circuit 42 includes an AND gate circuit 421 that generates the timing signal DSSRTLB by logic synthesis of the internal data strobe signal IDQS and an enable signal WRSRTLB. The enable signal WRSRTLB is generated by an AND gate circuit 422 that performs logic synthesis of the write start signal WRSRT and a mask signal MASK. The mask signal MASK is a signal for masking a portion of the write start signal WRSRT. The timing signal generation circuit 42 further includes a burst counter 423 that counts the internal data strobe signal IDQS. The burst counter 423 counts the internal data strobe signal IDQS in a period in which high level data is latched by a latch circuit 425, thereby detecting an end timing of burst input of the write data DQ. To the burst counter 423, the signal BL, the signal GAP, the signal CRC, and the signal WPRE described above are input. The burst counter 423 can correctly decide the end timing of burst input based on these signals. When the burst counter 423 decides the end of burst input, the burst counter 423 activates a write end signal WREND to a high level. When the write end signal WREND is activated to a high level, a latch circuit 424 and the latch circuit 425 are reset. The mask signal MASK thus changes to be at a high level. That is, masking of the write start signal WRSRT by the mask signal MASK is canceled. The latch circuit 424 thus reset is set again when the timing signal DSSRTLB is activated. After the latch circuit 424 is set, the latch circuit 425 thus reset is set again in response to the internal data strobe signal IDQS.

Figure 8:
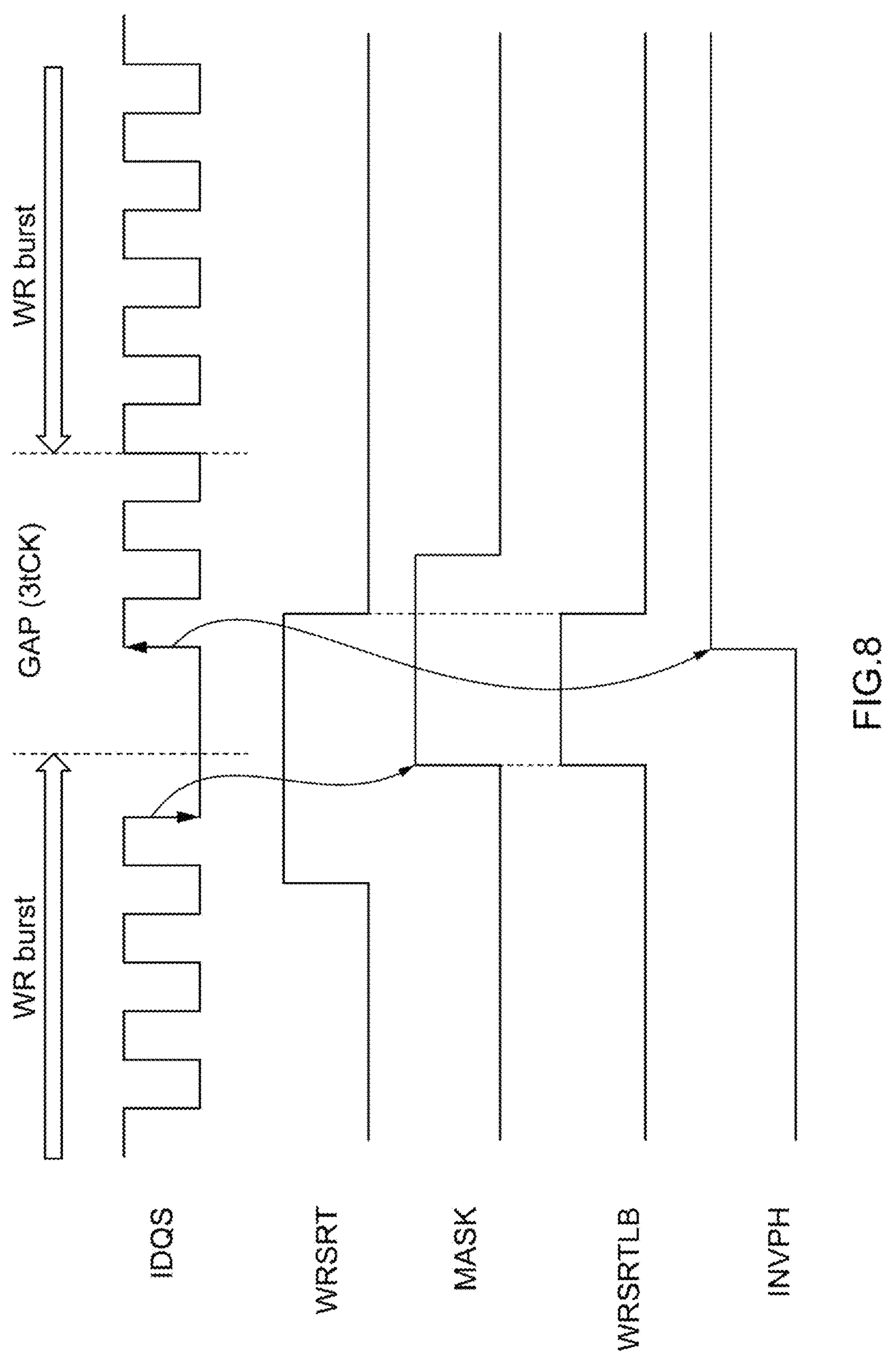
FIG. 8 is a timing chart for explaining an operation of the selection signal generation circuit.

FIG. 8 is a timing chart for explaining an operation of the selection signal generation circuit 40. In the example shown in FIG. 8, the write start signal WRSRT is activated earlier than an ideal timing, as in the case shown in FIG. 6B. However, since the mask signal MASK is kept at a low level while burst input in a previous write operation is performed, the state where the enable signal WRSRTLB is inactive at a low level is maintained even if the write start signal WRSRT is activated. Thereafter, when the end of burst input is detected by the burst counter 423, the write end signal WREND is activated, and the latch circuit 425 is reset. Accordingly, the mask signal MASK is activated to a high level, and the enable signal WRSRTLB also changes to be at a high level. Thereafter, when the internal data strobe signal IDQS changes from a low level to a high level, the timing signal DSSRTLB changes to be at a high level, so that the selection signal INVPH based on the selection signal SEL is output from the latch circuit 43.

As described above, in the present embodiment, activation of the enable signal WRSRTLB is prohibited by the mask signal MASK while burst input in a previous write operation is performed. Therefore, even if a period in which the write start signal WRSRT is active and a period in which the internal data strobe signal IDQS is input in association with the previous write operation partially overlap each other, the selection signal INVPH can be changed after the period of input of the internal data strobe signal IDQS in association with the previous write operation ends. With this configuration, errors in a loopback operation caused by a timing difference between the write start signal WRSRT and the data strobe signal DQS are prevented.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a first circuit configured to receive a plurality of first write data responsive to a first write command and then a plurality of second write data responsive to a second write command following the first write command;

a second circuit coupled to the first circuit, the second circuit being configured to select one or ones of the plurality of first write data and one or ones of the plurality of second write data based, at least in part, on a first selection signal and a second selection signal following the first selection signal, respectively; and a third circuit configured to:

receive a second internal write command signal provided correspondingly to the second write command;

mask a portion of the second internal write command signal having a timing which partially overlaps a timing of the plurality of first write data to provide a masked second internal write command signal; and provide the second selection signal based, at least in part, on the masked second internal command signal.

2. The apparatus of claim 1, wherein the second circuit is configured to select the one or ones of the plurality of first write data having a first phase when the first selection signal is in a first state and select the one or ones of the plurality of second write data having the first phase when the second selection signal is in the first state.

3. The apparatus of claim 2, wherein the second circuit is configured to select the one or ones of the plurality of first write data having a second phase different from the first phase when the first selection signal is in a second state different from the first state and select the one or ones of the plurality of second write data having the second phase when the second selection signal is in the second state.

4. The apparatus of claim 3, wherein the second circuit is configured to select the one or ones of the plurality of first write data having the first phase when the first selection signal is in the first state and select the one or ones of the plurality of second write data having the second phase when the second selection signal is in the second state.

5. The apparatus of claim 4, wherein the second phase is different in 180° from the first phase.

6. The apparatus of claim 5, wherein the first circuit is configured to latch the plurality of first write data and the plurality of second write data synchronously with an internal data strobe signal.

7. The apparatus of claim 6, wherein the third circuit is configured to make a state of the second selection signal different from a state of the first selection signal when a toggle count of the internal data strobe signal in a period between an end time of receiving the plurality of first write data and a start time of receiving the plurality of second write data is odd numbered.

8. The apparatus of claim 7, wherein the third circuit is configured to make a state of the second selection signal same as a state of the first selection signal when a toggle count of the internal data strobe signal in the period is even numbered.

9. The apparatus of claim 6, wherein the third circuit is configured to decide a state of the second selection signal synchronously with the internal data strobe signal.

10. An apparatus comprising:

a first circuit configured to intermittently receive a plurality of write data sets each including a plurality of write data received in serial from outside responsive to a plurality of write commands, respectively;

a second circuit configured to select one or ones of the plurality of write data from each of the plurality of write data sets based on a selection signal and loopback the selected one or ones of the plurality of write data to outside; and a third circuit configured to generate the selection signal, wherein the third circuit is configured to prevent a value of the selection signal from changing while the first circuit receives any of the plurality of write data sets.

11. The apparatus of claim 10, wherein the first circuit is configured to receive the plurality of write data of each of the plurality of write data sets synchronously with a data strobe signal, and wherein the third circuit is configured to change the value of the selection signal synchronously with the data strobe signal.

12. The apparatus of claim 11, wherein the third circuit is configured to change the value of the selection signal synchronously with the data strobe signal when an enable signal is in an active state.

13. The apparatus of claim 12, wherein the enable signal is brought into an active state each time the first circuit finishes receiving the plurality of write data sets.

14. The apparatus of claim 13, wherein the plurality of write data sets includes a first plurality of write data sets supplied responsive to a first occurrence of the write command and a second plurality of write data sets supplied responsive to a second occurrence of the write command, and wherein the third circuit is configured to change the state of the selection signal after the first circuit finishes receiving the first plurality of write data sets and before the first circuit starts receiving the second plurality of write data sets.

15. The apparatus of claim 14, further comprising a fourth circuit configured to activate a write start signal responsive to the second occurrence of the write command before the first circuit starts receiving the second plurality of write data, p1 wherein the third circuit is configured to activate the enable signal under a condition that the write start signal is in an active state.

16. The apparatus of claim 15, wherein the third circuit is configured to bring the enable signal into an inactive state even if the write start signal is in an active state until the first circuit finishes receiving the first plurality of write data.

17. The apparatus of claim 14, wherein the first circuit is configured to receive the data strobe signal to generate an internal data strobe signal, and wherein the third circuit is configured to change the state of the selection signal when a toggle count of the internal data strobe signal in a period between an end time of receiving the first plurality of write data and a start time of receiving the second plurality of write data is odd numbered.

18. An apparatus comprising:

a first circuit configured to receive a first plurality of write data in a first period and receive a second plurality of write data in a second period after the first period;

a second circuit configured to activate an enable signal in a third period between the first period and the second period; and a third circuit configured to change a state of a selection signal indicating a phase of the second plurality of write data under a condition that the enable signal is in an active state, wherein the second circuit is configured to prevent the enable signal from activating in the first period.

19. The apparatus of claim 18, wherein each of the first and second plurality of write data are supplied synchronously with a data strobe signal.

20. The apparatus of claim 19, wherein the third circuit is configured to activate the selection signal synchronously with the data strobe signal.

* * * * *